United States Patent
Tang

(10) Patent No.: US 10,224,496 B2
(45) Date of Patent: Mar. 5, 2019

(54) OLED PACKAGE STRUCTURE AND OLED PACKAGE METHOD

(71) Applicant: Wuhan China Star Optoelectronics Technology Co., Ltd., Wuhan, Hubei (CN)

(72) Inventor: Fan Tang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 119 days.

(21) Appl. No.: 15/510,227

(22) PCT Filed: Nov. 18, 2016

(86) PCT No.: PCT/CN2016/106410
§ 371 (c)(1),
(2) Date: Mar. 9, 2017

(87) PCT Pub. No.: WO2018/076421
PCT Pub. Date: May 3, 2018

(65) Prior Publication Data
US 2018/0233681 A1    Aug. 16, 2018

(30) Foreign Application Priority Data
Oct. 31, 2016  (CN) .......................... 2016 1 0969589

(51) Int. Cl.
*H01L 51/00* (2006.01)
*H01L 51/52* (2006.01)
*H01L 51/56* (2006.01)

(52) U.S. Cl.
CPC ...... *H01L 51/0097* (2013.01); *H01L 51/5237* (2013.01); *H01L 51/5253* (2013.01);
(Continued)

(58) Field of Classification Search
CPC ............. H01L 51/0097; H01L 51/5237; H01L 51/5253; H01L 51/56
See application file for complete search history.

(56) References Cited

U.S. PATENT DOCUMENTS

2014/0034919 A1* 2/2014 Park .................... H01L 51/5275
257/40
2015/0014636 A1* 1/2015 Kang .................. H01L 51/5253
257/40
(Continued)

*Primary Examiner* — Christine A Enad
(74) *Attorney, Agent, or Firm* — Andrew C. Cheng

(57) ABSTRACT

The present application provides an OLED package structure, comprises a package unit and a flexible substrate deposited with an OLED element; the package unit comprises a first package layer, a first inorganic layer and a second package layer, which sequentially stack up on the OLED element; the first package layer comprises a first pixel region and a first pixel define region, and the film thickness of the first pixel define region gradually decreases from an edge to an interior of the first pixel define region; the second package layer comprises a second pixel region corresponding to the first pixel region and a second pixel define region corresponding to the first pixel define region, and the film thickness of the second pixel region gradually decreases from an edge to an interior of the second pixel region. The present application further provides an OLED package method.

10 Claims, 6 Drawing Sheets

(52) U.S. Cl.
CPC ...... *H01L 51/56* (2013.01); *H01L 2251/5338* (2013.01); *H01L 2251/558* (2013.01)

(56) References Cited

U.S. PATENT DOCUMENTS

2017/0125732 A1* 5/2017 Lee ..................... H01L 51/5253
2017/0271623 A1* 9/2017 Wang .................. H01L 51/5268

* cited by examiner

100 configuring a first mask on one side of the flexible substrate, which is deposited with an OLED element to make a gap between the first mask and the flexible substrate; wherein the first mask comprises a light transmitting portion and a light shielding portion, and the light shielding portion of the first mask comprises a first end and a second end which are opposite, and a width of the first end is smaller than a width of the second end, and the light shielding portion of the first mask corresponds to a pixel restriction layer on the flexible substrate, and the light transmitting portion of the first mask corresponds to pixels on the flexible substrate, and the first end faces toward the OLED element, and the second end is back on the OLED element — S110 depositing an inorganic material on the OLED element with the first mask to form a first package layer, and then removing the first mask; wherein a first pixel region corresponding to the pixels and a first pixel restriction region corresponding to the pixel restriction layer are formed in the first package layer, and a film thickness of the first pixel region is larger than a film thickness of the first pixel restriction region, and the film thickness of the first pixel restriction region gradually decreases from an edge to an interior of the first pixel restriction region — S120 depositing a first organic layer on the first package layer — S130 configuring a second mask on the first organic layer to make a gap between the second mask and the flexible substrate; wherein the second mask comprises a light transmitting portion and a light shielding portion, and the light shielding portion of the second mask comprises a third end and a fourth end which are opposite, and a width of the third end is smaller than a width of the fourth end, and the light shielding portion of the second mask corresponds to a pixel distribution region on the flexible substrate, and the light transmitting portion of the second mask corresponds to a pixel restriction distribution region on the flexible substrate, and the third end faces toward the first organic layer, and the fourth end is back on the first organic layer — S140 depositing an inorganic material on the first organic layer with the second mask to form a second package layer, and then removing the second mask; wherein a second pixel region corresponding to the first pixel region and a second pixel restriction region corresponding to the first pixel restriction region are formed in the second package layer, and a film thickness of the second pixel region is smaller than a film thickness of the second pixel restriction region, and the film thickness of the second pixel restriction region gradually decreases from an edge to an interior of the second pixel restriction region — S150

FIG. 7

OLED PACKAGE STRUCTURE AND OLED PACKAGE METHOD

CROSS REFERENCE

This application claims the priority of Chinese Patent Application No. 201610969589.5, entitled "OLED package structure and OLED package method", filed on Oct. 31, 2016, the disclosure of which is incorporated herein by reference in its entirety.

FIELD OF THE INVENTION

The present application relates to a flexible display technical field, and more particularly to an OLED package structure and an OLED package method.

BACKGROUND OF THE INVENTION

The flexible OLED (Organic Light-Emitting Diode) element generally employs the thin film package, in which the package structure comprises the inorganic thin film layer. The inorganic thin film layer is generally compact, and the thin film stress exists in the deposition process so that the bendability of the inorganic thin film layer is poor. When the flexible OLED is curled and folded, the inorganic thin film layer can easily have crack and peeling; once the crack occurs, crack pattern can be quickly spread, and ultimately leads to the large area failure of the flexible OLED element.

SUMMARY OF THE INVENTION

An objective of the present application is to provide an OLED package structure and an OLED package method, which can reduce the internal stress of the inorganic thin film layer in the OLED package structure to decrease crack and abnormal peeling.

An OLED package structure comprises a package unit and a flexible substrate deposited with an OLED element; the package unit comprises a first package layer, a first organic layer and a second package layer, which sequentially stack up on the OLED element, and both the first package layer and the second package layer are manufactured with an inorganic material; the first package layer comprises a first pixel region and a first pixel define region, and a film thickness of the first pixel region is larger than a film thickness of the first pixel define region, and the film thickness of the first pixel define region gradually decreases from an edge to an interior of the first pixel define region; the second package layer comprises a second pixel region corresponding to the first pixel region and a second pixel define region corresponding to the first pixel define region, and a film thickness of the second pixel region is smaller than a film thickness of the second pixel define region, and the film thickness of the second pixel region gradually decreases from an edge to an interior of the second pixel region.

The package unit further comprises a second organic layer and a third package layer, which sequentially stack up on the second package layer, and the third package is manufactured with an inorganic material; the third package layer comprises a third pixel region corresponding to the first pixel region and a third pixel define region corresponding to the first pixel define region, and a film thickness of the third pixel region is larger than a film thickness of the third pixel define region, and the film thickness of the third pixel define region gradually decreases from an edge to an interior of the third pixel define region.

The package unit further comprises an inorganic layer configured on the OLED element, and the inorganic layer is located between the OLED element and the first package layer.

The package unit further comprises a barrier film configured on the second package layer.

The package unit further comprises a barrier film configured on the third package layer.

The first pixel region completely covers a pixel region corresponding thereto, and an area of the first pixel region is larger than an area of the pixel region, and the pixel region comprises one or more than two of the OLED elements.

An OLED structure comprises a package unit and a flexible substrate deposited with an OLED element; the package unit comprises a first package layer and a second package layer, which sequentially stack up on the OLED element, and both the first package layer and the second package layer are manufactured with a doped material; the first package layer comprises a first pixel region and a first pixel define region, and a film thickness of the first pixel region is larger than a film thickness of the first pixel define region, and the film thickness of the first pixel define region gradually decreases from an edge to an interior of the first pixel define region; the second package layer comprises a second pixel region corresponding to the first pixel region and a second pixel define region corresponding to the first pixel define region, and a film thickness of the second pixel region is smaller than a film thickness of the second pixel define region, and the film thickness of the second pixel region gradually decreases from an edge to an interior of the second pixel region.

An OLED package method comprises: configuring a first mask on one side of the flexible substrate, which is deposited with an OLED element to make a gap between the first mask and the flexible substrate; wherein the first mask comprises a light transmitting portion and a light shielding portion, and the light shielding portion of the first mask comprises a first end and a second end which are opposite, and a width of the first end is smaller than a width of the second end, and the light shielding portion of the first mask corresponds to a pixel define layer on the flexible substrate, and the light transmitting portion of the first mask corresponds to pixels on the flexible substrate, and the first end faces toward the OLED element, and the second end is back on the OLED element; depositing an inorganic material on the OLED element with the first mask to form a first package layer, and then removing the first mask; wherein a first pixel region corresponding to the pixels and a first pixel define region corresponding to the pixel define layer are formed in the first package layer, and a film thickness of the first pixel region is larger than a film thickness of the first pixel define region, and the film thickness of the first pixel define region gradually decreases from an edge to an interior of the first pixel define region; depositing a first organic layer on the first package layer; configuring a second mask on the first organic layer to make a gap between the second mask and the flexible substrate; wherein the second mask comprises a light transmitting portion and a light shielding portion, and the light shielding portion of the second mask comprises a third end and a fourth end which are opposite, and a width of the third end is smaller than a width of the fourth end, and the light shielding portion of the second mask corresponds to a pixel distribution region on the flexible substrate, and the light transmitting portion of the second mask corresponds to a pixel restriction distribution region on the flexible substrate, and the third end faces toward the first organic layer, and the fourth end is back on the first organic layer; depositing an inorganic material on the first organic layer with the second mask to form a second package layer, and then removing the second mask; wherein a second pixel region corresponding to the first pixel region and a second pixel define region corresponding to the first pixel define region are formed in the second package layer, and a film thickness of the second pixel region is smaller than a film thickness of the second pixel define region, and the film thickness of the second pixel region gradually decreases from an edge to an interior of the second pixel region.

The method further comprises: depositing a second organic layer on the second package layer; configuring the first mask on the second organic layer to make a gap between the first mask and the flexible substrate, wherein the light shielding portion of the first mask corresponds to the pixel define layer on the flexible substrate, and the light transmitting portion of the first mask corresponds to the pixels of the flexible substrate, and the first end faces toward the second organic layer, and the second end is back on the second organic layer; depositing an inorganic material on the second organic layer with the first mask to form a third package layer, and then removing the first mask; wherein a third pixel region corresponding to the first pixel region and a third pixel define region corresponding to the first pixel define region are formed in the third package layer, and a film thickness of the third pixel region is larger than a film thickness of the third pixel define region, and the film thickness of the third pixel define region gradually decreases from an edge to an interior of the third pixel define region.

Before the step of configuring the first mask on one side of the flexible substrate, the method further comprises: depositing an inorganic layer on the OLED element, wherein the inorganic layer is located between the OLED element and the first package layer.

The method further comprises: forming a barrier film on the second package layer.

The method further comprises: forming a barrier film on the third package layer.

An OLED package method comprises: configuring a first mask on one side of the flexible substrate, which is deposited with an OLED element to make a gap between the first mask and the flexible substrate; wherein the first mask comprises a light transmitting portion and a light shielding portion, and the light shielding portion of the first mask comprises a first end and a second end which are opposite, and a width of the first end is smaller than a width of the second end, and the light shielding portion of the first mask corresponds to a pixel define layer on the flexible substrate, and the light transmitting portion of the first mask corresponds to pixels on the flexible substrate, and the first end faces toward the OLED element, and the second end is back on the OLED element; depositing a doped material on the OLED element with the first mask to form a first package layer, and then removing the first mask; wherein a first pixel region corresponding to the pixels and a first pixel define region corresponding to the pixel define layer are formed in the first package layer, and a film thickness of the first pixel region is larger than a film thickness of the first pixel define region, and the film thickness of the first pixel define region gradually decreases from an edge to an interior of the first pixel define region; configuring a second mask on the first package layer to make a gap between the second mask and the flexible substrate; wherein the second mask comprises a light transmitting portion and a light shielding portion, and the light shielding portion of the second mask comprises a third end and a fourth end which are opposite, and a width of the third end is smaller than a width of the fourth end, and the light shielding portion of the second mask corresponds to a pixel distribution region on the flexible substrate, and the light transmitting portion of the second mask corresponds to a pixel restriction distribution region on the flexible substrate, and the third end faces toward the first package layer, and the fourth end is back on the first package layer; depositing a doped material on the first package layer with the second mask to form a second package layer, and then removing the second mask; wherein a second pixel region corresponding to the first pixel region and a second pixel define region corresponding to the first pixel define region are formed in the second package layer, and a film thickness of the second pixel region is smaller than a film thickness of the second pixel define region, and the film thickness of the second pixel region gradually decreases from an edge to an interior of the second pixel region.

Therefore, in the solution of the present application, both the light shielding portion of the first mask and the light shielding portion of the second mask are configured to be the shapes, of which one end is wider than the other end, and thus the first package layer and the second package layer, of which the region with the larger film thickness and the region with the smaller film thickness are adjacent and alternately arranged can be respectively formed with the first mask and the second mask. In comparison with the solution of forming the first package layer and the second package layer with the uniform film thickness (the thin film stresses in the respective regions are basically consistent), the present solution can make the thin film stresses of the first package layer and the second package layer gradually decrease from the region with the larger film thickness to the region with the smaller film thickness to decrease the crack and peeling occurring possibilities; with depositing the first organic layer with flexibility, it can not only buffer, absorb and reduce the thin film stresses of the first package layer and the second package layer but also reduce the risk that a crack occurs, and moreover, it also can act the function to the planarization of the first package layer to promote the deposition quality of the second package layer; besides, with arrangement of dislocating the light shielding portion of the first mask from the light shielding portion of the second mask, the structure that the thick portion and the thin portion on the first package layer and the thick portion and the thin portion on the second package layer are in staggered correspondence arrangement makes that the thicker portion on the second package layer just makes up the thinner portion on the first package layer, and thus to act the enhancement function to the water, oxygen resistance capability of the first package layer.

BRIEF DESCRIPTION OF THE DRAWINGS

In order to more clearly illustrate the embodiments of the present invention, the following figures will be described in the embodiments are briefly introduced. It is obvious that the drawings are only some embodiments of the present invention, those of ordinary skill in this field can obtain other figures according to these figures without paying the premise.

FIG. 7 is a schematic flow block diagram of an OLED package method according to the embodiment of the present application.

DETAILED DESCRIPTION OF PREFERRED EMBODIMENTS

For better explaining the technical solution and the effect of the present invention, the present invention will be further described in detail with the accompanying drawings in the specific embodiments. It is clear that the described embodiments are part of embodiments of the present application, but not all embodiments. Based on the embodiments of the present application, all other embodiments to those of ordinary skill in the premise of no creative efforts obtained, should all be considered within the scope of protection of the present application.

Figure 1:
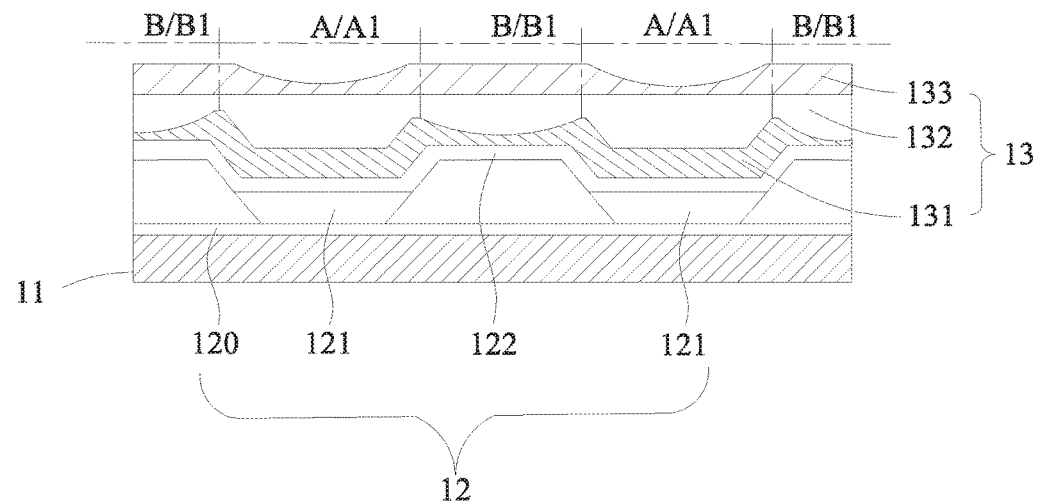
FIG. 1 is a diagram of an OLED package structure according to the first embodiment of the present application.

As shown in FIG. 1, the OLED package structure 10 of the first embodiment comprises a package unit 13 and a flexible substrate 11 deposited with an OLED element 12. The OLED element 12 comprises an anode 120, a light emitting layer 121 and a cathode 122 which are sequentially deposited on the flexible substrate 11. In this embodiment, for simplification, the other function layers in the OLED element 12 are not shown. It should be understood that this is not the restriction to the present application. The package unit 13 is located on the OLED element 12 and employed to package the OLED element 12.

The package unit 13 comprises a first package layer 131, a first organic layer 132 and a second package layer 133. Both the first package layer 131 and the second package layer 133 are manufactured with an inorganic material. The first package layer 131 is deposited on the cathode 122 of the OLED element 12, and the first organic layer 132 is deposited on the first package layer 131, and the second package layer 133 is deposited on the first organic layer 132. A plurality of pixels and pixel define layers (not shown in figure) are distributed on the flexible substrate 11, and the pixels and the pixel define layers are adjacent and alternately arranged. The plurality of pixels are distributed in A/A1 (i.e. A or A1) region in FIG. 1, and the plurality of pixel define layers are distributed in B/B1 (B or B1) region in FIG. 1. The first package layer 131 comprises a first pixel region A and a first pixel define region B. The first pixel region A corresponds to the region where the pixels are distributed, and the first pixel define region B corresponds to the region where the pixel define layers are distributed. The film thickness of the first package layer 131 is in nonuniform distribution. Specifically, a film thickness of the first pixel region A is larger than a film thickness of the first pixel define region B. The first pixel region A with the larger film thickness and the first pixel define region B with the smaller film thickness are adjacent and alternately arranged. The film thickness of the first pixel define region B gradually decreases from an edge of the first pixel define region B to an interior of the first pixel region B, and the film thickness appears to be in gradient descent. Correspondingly, the second package layer 133 comprises a second pixel region A1 and a second pixel define region B1. The second pixel regions A1 correspond to the first pixel regions A, and namely, the second pixel regions A1 also correspond to the region where the pixels are distributed; the second pixel define regions B1 correspond to the first pixel regions B, and namely, the second pixel define regions B1 also correspond to the region where the pixel define layers are distributed. Similarly, the film thickness of the second package layer 133 is nonuniform distribution. The difference from the first package layer 131 is that a film thickness of the second pixel region A1 is smaller than a film thickness of the second pixel define region B1. The second pixel region A1 with the larger film thickness and the second pixel define region B1 with the smaller film thickness are adjacent and alternately arranged. The film thickness of the second pixel define region A1 gradually decreases from an edge of the second pixel define region A1 to an interior of the second pixel define region A1, and the film thickness appears to be in gradient descent. As shown in FIG. 1, the thicker first pixel region A on the first package layer 131 corresponds to the thinner second pixel region A1 on the second package layer 133, and the thinner first pixel define region B on the first package layer 131 corresponds to the thicker second pixel define region B1 of the second package layer 133, and thus, the structure that the thick portion and the thin portion on the package layers are in staggered correspondence arrangement.

Besides, as shown in FIG. 1, the surface of the A/A1 (i.e. A or A1) region where the pixels are distributed is covered with the first package layer 131 with the larger film thickness, i.e. the pixel region is covered by the first pixel region A of the first package layer 131. The first pixel region A completely covers the corresponding pixel region, and the area of the first pixel region A is larger than the area of the pixel region; besides, the first pixel region A further covers the anode 122 partially in the pixel define layer region B/B1 (i.e. B or B1) to ensure that the pixel region can effectively insulated from the water and oxygen.

It can be understood that in the embodiment of the present application, the pixel region on the flexible substrate 11 corresponding to the first pixel region A can be constructed with single sub pixel (i.e. one OLED element), or can be constructed with a plurality of sub pixels (i.e. a plurality of OLED elements).

In this embodiment, the film thicknesses of the corresponding regions in the aforesaid two package layers appear to be in continuously gradient descent. With mapping to FIG. 1, one side edge on the transverse section of the film thickness is two curves dented toward the middle. The curve shown in FIG. 1 is an arc. However, practically, the present application is not limited thereto. The decreasing gradient of the film thickness can be set according to the demands to make the curves to be other shapes.

In this embodiment, with the first organic layer 132 located between the two package layers form a sandwich biscuit structure. Because the first organic layer 132 is flexible and can buffer, absorb and reduce the thin film stresses of the aforesaid two package layers manufactured with the organic material, and thus to reduce the risk that a crack occurs to the aforesaid two package layers. With the structure that the first package layer 131 and the second package layer 133 are configured to be the region with the larger thin film thickness and the region with the smaller film thickness, which are adjacent and alternately arranged, it can be obtained that the thin film stresses of the first package layer 131 and the second package layer 133 gradually decreases from the region with the larger thin film thickness to the region with the smaller film thickness, and decrease the crack occurring possibility in advance. Moreover, even the crack occurs, because the film thickness of the first pixel define region B is smaller, the abnormal crack and the film layer peeling phenomenon caused thereby will only appear in the first pixel define region B (which only results in tiny changes, such as the capacitance change), and will not spread to the first pixel region A, and thus to prevent the serious abnormality, such as that the pixel cannot be lighted. Besides, the first pixel region A with the larger film thickness can effectively stop the permeation of the water and oxygen to form the effective protection to the pixel region. Besides, with the configuration of the structure that the thick portion and the thin portion on the package layers are in staggered correspondence arrangement of the second package layer 132 and the first package layer 131, the thicker portion on the second package layer 132 just makes up the thinner portion on the first package layer 131, and thus to act the enhancement function to the water, oxygen resistance capability of the first package layer 131. Besides, the second package layer 132 also can act the function to the planarization of the first package layer 131 to promote the deposition quality of the second package layer 133.

Figure 2:
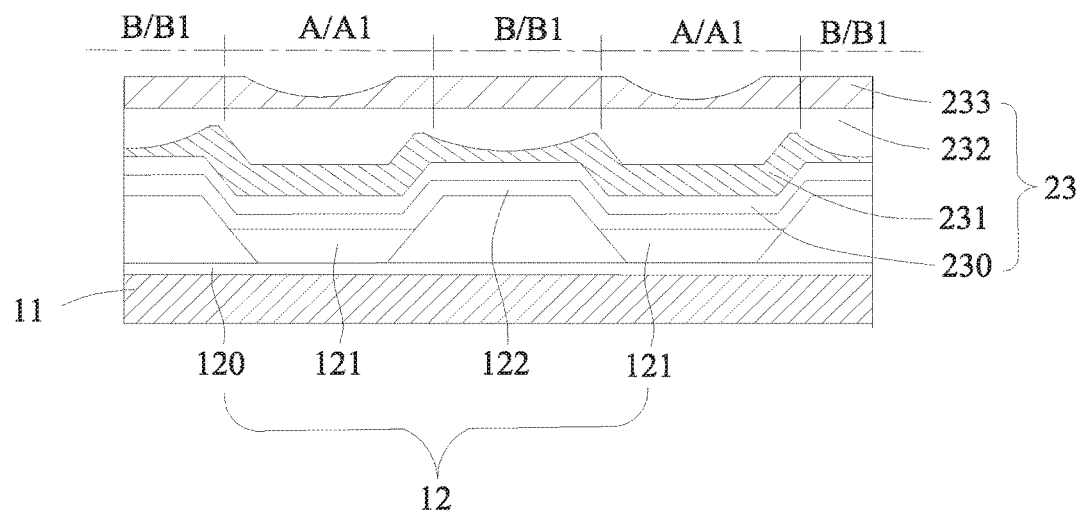
FIG. 2 is a diagram of an OLED package structure according to the second embodiment of the present application.

FIG. 2 shows the OLED package structure 20 according to the second embodiment of the present application, which comprises a package unit 23. As shown in FIG. 2, in the second embodiment of the present application, what is the same as the aforesaid first embodiment is that the first organic layer 232 in the package unit 23 is deposited on the first package layer 231, and the second package layer 233 is deposited on the first organic layer 232; but the difference from the first embodiment is that the package unit 23 further comprises an inorganic layer 230 deposited on the OLED element 12, and the inorganic layer 230 is located between the OLED element 12 and the first package layer 231. Specifically, the inorganic layer 230 is deposited on the cathode 122 in the OLED element 12, and the inorganic layer 230 is located between the cathode 122 and the first package layer 231. In this embodiment, the configuration of the inorganic layer 230 is to protect the OLED element 12 to prevent the damage of the following package to the OLED element 12. The inorganic layer 230 can be manufactured by utilizing kinds of processes, such as thermal evaporation of Lithium fluoride (LiF).

Figure 3:
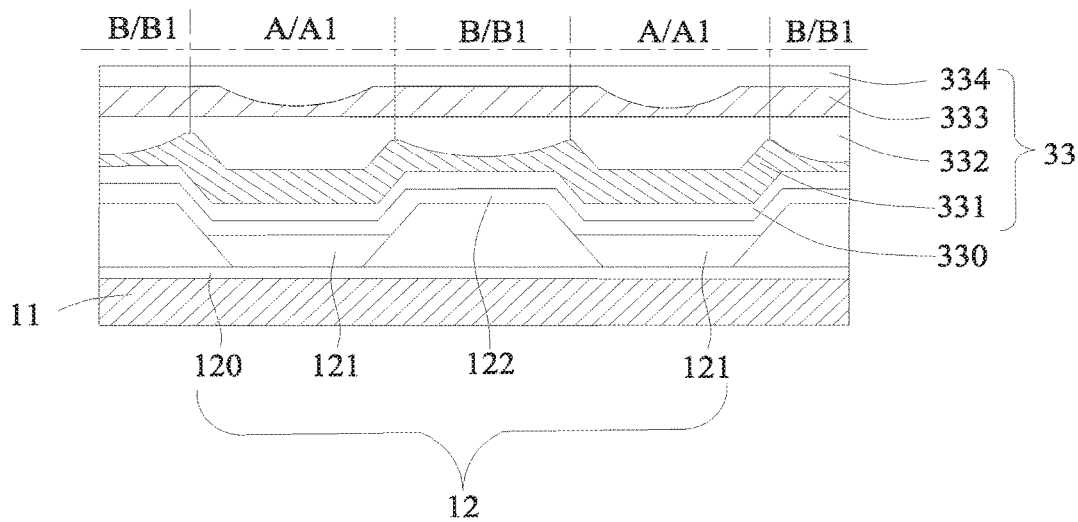
FIG. 3 is a diagram of an OLED package structure according to the third embodiment of the present application.

FIG. 3 shows an OLED package structure 30 according to the third embodiment of the present application, which comprises a package unit 33. As shown in FIG. 3, in the third embodiment of the present application, what is the same as the second embodiment is that the first package layer 331 in the package unit 33 is deposited on the inorganic layer 330, and the first organic layer 332 is deposited on the first package layer 331, and the second package layer 333 is deposited on the first organic layer 332. However, the difference from the second embodiment is that the package unit 33 further comprises a barrier film 334 deposited on the second package layer 333. In this embodiment, the configuration of the barrier film 334 is to protect the entire package structure. The process of the configuration of the barrier film 334 can comprise adhesion but not limited thereto.

Figure 4:
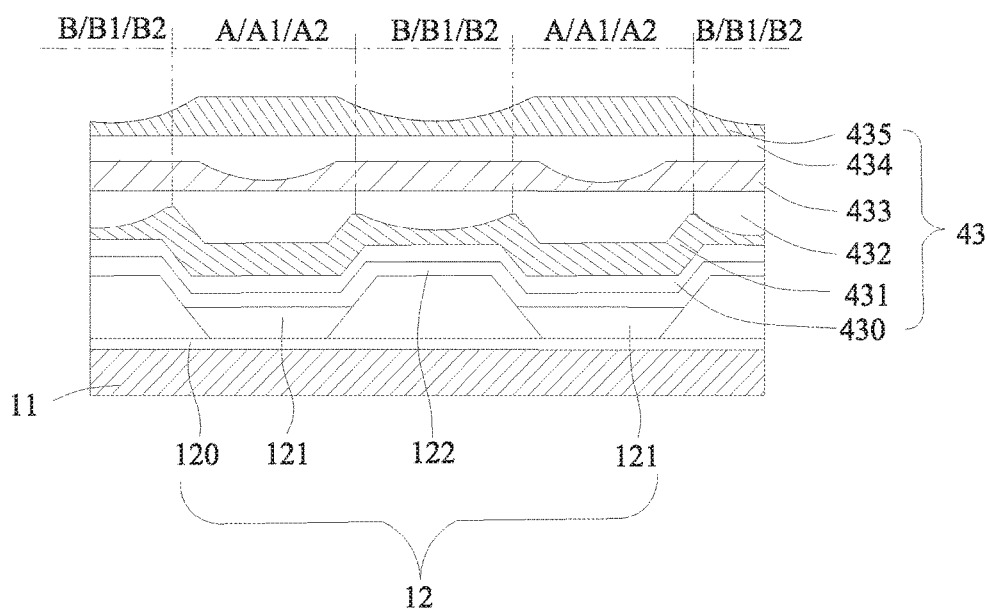
FIG. 4 is a diagram of an OLED package structure according to the fourth embodiment of the present application.

FIG. 4 shows an OLED package structure 40 according to the fourth embodiment of the present application, which comprises a package unit 43. As shown in FIG. 4, what is the same as the second embodiment is that the first package layer 431 in the package unit 43 is deposited on the inorganic layer 430, and the first organic layer 432 is deposited on the first package layer 431, and the second package layer 433 is deposited on the first organic layer 432; but the difference from the second embodiment is that the package unit 43 further comprises a second organic layer 434 deposited on the second package layer 433 and a third package layer 435 deposited on the second organic layer 434. The third package layer 435 is manufactured with an inorganic material. The third package layer 435 comprises a third pixel region A2 and a third pixel define region B2. The third pixel regions A2 correspond to the first pixel regions A, and namely, the third pixel regions A2 also correspond to the region where the pixels are distributed; the third pixel define regions B2 correspond to the first pixel regions B, and namely, the third pixel define regions B2 also correspond to the region where the pixel define layers are distributed. Similarly, the film thickness of the third package layer 435 is also in nonuniform distribution. Specifically, a film thickness of the third pixel region A2 is larger than a film thickness of the third pixel define region B2. The third pixel region A2 with the larger film thickness and the third pixel define region B2 with the smaller film thickness are adjacent and alternately arranged. The film thickness of the second pixel define region B2 gradually decreases from an edge of the second pixel define region B2 to an interior of the second pixel define region B2, and the film thickness appears to be in gradient descent. Namely, the distribution of the thick regions and the thin regions on the third package layer 435 is in accordance with the distribution of the thick regions and the thin regions on the first package layer 431, and corresponds to the distribution of the thick regions and the thin regions on the second package layer 433. Thus, the thin film stress of the third package layer 435 can be decreased to reduce the risk of crack and occurrence of more serious abnormality; meanwhile it acts the enhancement function to the water, oxygen resistance capability of the second package layer 433. Because the principle of this technical result has been described in detail in the aforesaid embodiment, and thus, the repeated description is omitted here. In this embodiment, on the basis of the second embodiment, the second organic layer 434 and the third package layer 435 are additionally stacked to form the dual sandwich biscuit structure, which can be applied to another package requirement of the OLED element. In other embodiment, the organic layers and package layers of more numbers can be deposited and stacked according to the requirement to realize the multi-layer sandwich biscuit structure; and/or in other embodiments, the inorganic layer 430 also can be omitted but the first package layer 431 is directly deposited on the cathode 122.

Figure 5:
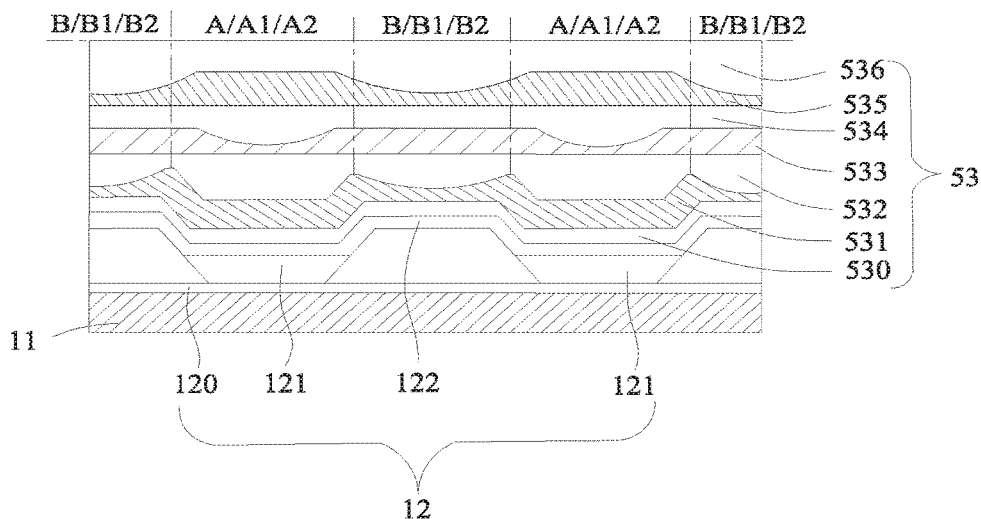
FIG. 5 is a diagram of an OLED package structure according to the fifth embodiment of the present application.

FIG. 5 shows an OLED package structure 50 according to the fifth embodiment of the present application, which comprises a package unit 53. AS shown in FIG. 5, in the fifth embodiment of the present application, what is the same as the fourth embodiment is that the first package layer 531 in the package unit 53 is deposited on the inorganic layer 530, and the first organic layer 532 is deposited on the first package layer 531, and the second package layer 533 is deposited on the first organic layer 532, and the second organic layer 534 is deposited on the second package layer 533, and the third package layer 535 is deposited on the second organic layer 534. However, the difference from the fourth embodiment is that the package unit 53 further comprises a barrier film 536 deposited on the third package layer 535. In this embodiment, the configuration of the barrier film 536 is to protect the entire package structure. The process of the configuration of the barrier film 636 can comprise adhesion but not limited thereto.

Figure 6:
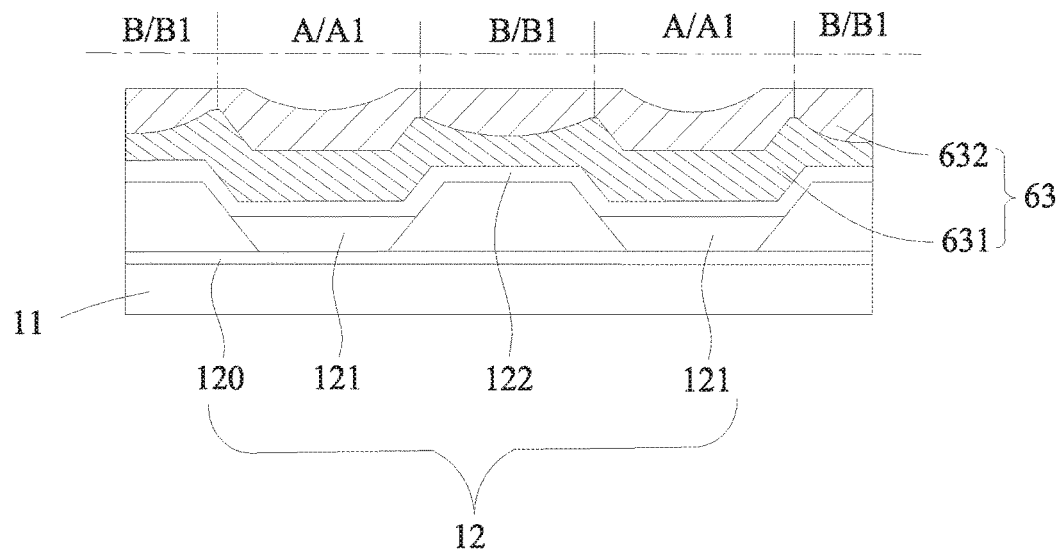
FIG. 6 is a diagram of an OLED package structure according to the sixth embodiment of the present application.

All of the first embodiment to the fifth embodiment are sandwich biscuit structures of two package layers with one organic layer in between. The respective package layers are all manufactured with an inorganic material. FIG. 6 shows an OLED package structure 60 according to the sixth embodiment of the present application, which comprises a package 63. As shown in FIG. 6, in this embodiment, the difference from the aforesaid embodiments is that the package 63 merely comprises two package layers, a first package layer 631 and a second package layer 632. Both the first package layer 631 and the second package layer 632 are doped materials. The material property of the doped material is between the organic material and the inorganic material. The anti crack property of the film layer manufactured with this material can be promoted. Thus, there is no need to configure an organic layer between the first package layer 631 and the second package layer 632. Namely, the risk of the crack occurrence among the respective package layers can be reduced. Furthermore, with the structure that the first package layer 631 and the second package layer 632 are configured to be the region with the larger thin film thickness and the region with the smaller film thickness, which are alternately adjacent, the probabilities of the thin film stresses of the respective package layers and the crack occurrence can be decreased in advance to make up the capability of the first package layer 631 resisting water and oxygen. In other embodiments, as described in the respective embodiments, the OLED package structure can further comprise an inorganic layer deposited on the cathode 122 and/or a barrier layer deposited on the second package layer 632.

The OLED package structures described in the aforesaid embodiments are for all the elements on the entire flexible substrate. Namely, one package unit packages all the OLED elements (i.e. one package unit packages all the sub pixels).

As aforementioned, in the embodiment of the present application, the pixel region on the flexible substrate 11 corresponding to the first pixel region A can be constructed with single sub pixel (i.e. one OLED element), or can be constructed with a plurality of sub pixels (i.e. a plurality of OLED elements). In the seventh embodiment of the present application, a portion of the OLED elements (i.e. a portion of sub pixels) on the flexible substrate can be respectively packaged. Namely, the package unit can package only one or more than two OLED elements (i.e. one or more than two sub pixels). In this embodiment, the structure of the package unit is the same as the aforesaid embodiment. As curling the elements for the first package layer 131 and the second package layer 133, in which the thickness is nonuniform, being configured with one or more than two OLED elements, in comparison with the curled radius, the deformation of each of the configured unit with small film thickness nonuniform inorganic layer is extremely small. It is equivalent to that the previous entire package unit is divided into a plurality of package units so that the inorganic layer is hard to be peeled. Therefore, with adjustment of package process difficulty, such solution can satisfy various package requirements.

With combination of the OLED package structures of the embodiments of the present application which are described in detail in FIG. 1-FIG. 6, the OLED package methods of the embodiments of the present application in FIG. 7-FIG. 10. The OLED package method is applied for manufacturing the OLED package structure.

As shown in FIG. 7, the OLED package method 100 of the eighth embodiment of the present application comprises:

S110, configuring a first mask on one side of the flexible substrate, which is deposited with an OLED element to make a gap between the first mask and the flexible substrate; wherein the first mask comprises a light transmitting portion and a light shielding portion, and the light shielding portion of the first mask comprises a first end and a second end which are opposite, and a width of the first end is smaller than a width of the second end, and the light shielding portion of the first mask corresponds to a pixel define layer on the flexible substrate, and the light transmitting portion of the first mask corresponds to pixels on the flexible substrate, and the first end faces toward the OLED element, and the second end is back on the OLED element;

S120, depositing an inorganic material on the OLED element with the first mask to form a first package layer, and then removing the first mask; wherein a first pixel region corresponding to the pixels and a first pixel define region corresponding to the pixel define layer are formed in the first package layer, and a film thickness of the first pixel region is larger than a film thickness of the first pixel define region, and the film thickness of the first pixel define region gradually decreases from an edge to an interior of the first pixel define region;

S130, depositing a first organic layer on the first package layer;

S140, configuring a second mask on the first organic layer to make a gap between the second mask and the flexible substrate; wherein the second mask comprises a light transmitting portion and a light shielding portion, and the light shielding portion of the second mask comprises a third end and a fourth end which are opposite, and a width of the third end is smaller than a width of the fourth end, and the light shielding portion of the second mask corresponds to a pixel distribution region on the flexible substrate, and the light transmitting portion of the second mask corresponds to a pixel restriction distribution region on the flexible substrate, and the third end faces toward the first organic layer, and the fourth end is back on the first organic layer;

S150, depositing an inorganic material on the first organic layer with the second mask to form a second package layer, and then removing the second mask; wherein a second pixel region corresponding to the first pixel region and a second pixel define region corresponding to the first pixel define region are formed in the second package layer, and a film thickness of the second pixel region is smaller than a film thickness of the second pixel define region, and the film thickness of the second pixel region gradually decreases from an edge to an interior of the second pixel region.

Figure 8:
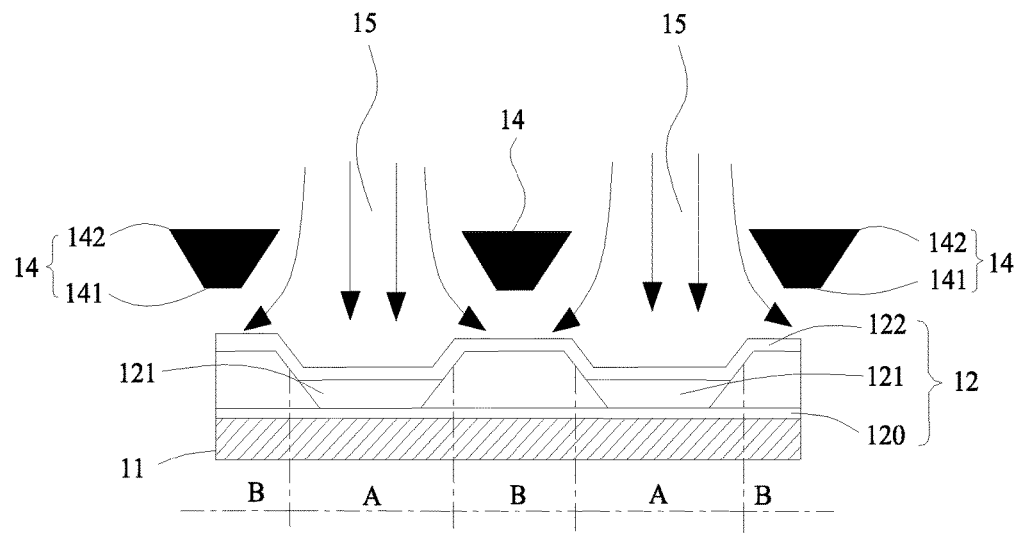
FIG. 8 is a process operation diagram in the OLED package method shown in FIG. 7.

In S110, as specifically shown in FIG. 8, the OLED 12 was deposited on the flexible substrate 11. The OLED 12 comprises an anode 120, a light emitting layer 121 and a cathode 122 which are sequentially deposited on the flexible substrate 11. A plurality of pixels and a plurality of pixel define layers (not shown in figure) are distributed on the flexible substrate 11, and the pixels and the pixel define layers are adjacent and alternately arranged. The pixels are distributed in the A region in FIG. 1. The pixel define layers are distributed in the B region in FIG. 1. In this embodiment, for simplification, the other function layers in the OLED element 12 are not shown. It should be understood that this is not the restriction to the present application. The first mask is located at one side of the flexible substrate 11 which is deposited with the OLED element 12 (i.e. located on the cathode 122), and there is a gap between the first mask and the flexible substrate 11. In this embodiment, the gap between the first mask and the flexible substrate 11 is a first distance. The specific number of the first mask is determined according to the actual requirement. The first mask comprises a light shielding portion 14 and a light transmitting portion 15 which are in alternately adjacent arrangement. The package material is deposited on the cathode 122 through the light transmitting portion 15. The light shielding portion 14 comprises a first end 141 and a second end 142 which are opposite, and a width of the first end 141 is smaller than a width of the second end 142. In the sectional view diagram of the first mask shown in FIG. 8, a dimension of the first end 141 is smaller than a dimension of the second end 142 along the horizontal direction. The light shielding portion 14 appears to be a big end up inverted trapezoid. In this embodiment, the light shielding portion 14 is illustrated to be a big end up inverted trapezoid: in other embodiments, under the premise that the width of the first end is smaller than the width of the second, the light shielding portion 14 can be in other shapes. The first end 141 faces toward the OLED element 12 (i.e. faces toward the cathode 122), and the second end 142 is back on the OLED element 12 (i.e. back on the cathode 122), and the light shielding portion 14 is configured corresponding to the pixel define layer (i.e. corresponding to the B region), and the light transmitting portion 15 is configured corresponding to the pixels (i.e. corresponding to the A region).

Figure 9:
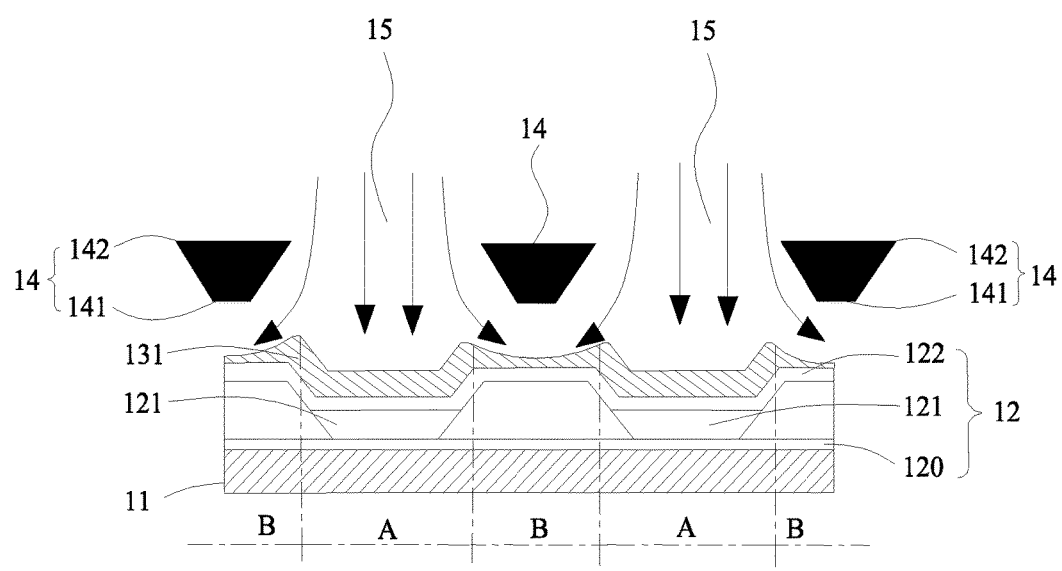
FIG. 9 is another process operation diagram in the OLED package method shown in FIG. 7.

In S120, as specifically shown in FIG. 9, the inorganic material is deposited on the OLED element (i.e. on the cathode 122) through the first mask to form the first package layer 131, and then the first mask is removed. Because the first mask has Shadow Effect, i.e. the film thickness deposited in the light transmitting portion 15 is larger, and the film thickness deposited in the light shielding portion 14 is smaller. Therefore, the film thickness of the A region corresponding to the pixels is larger, and the film thickness of the B region corresponding to the pixel define layer is smaller in the first package layer 131. Namely, the first package layer 131 is formed with a first pixel region A and a first pixel define region B. A film thickness of the first pixel region A is larger than a film thickness of the first pixel define region B. Because the light shielding portion 14 is a big end up inverted trapezoid, the closer to the edge of the light shielding portion 14, and the more the deposition volume of the inorganic material is, and the closer to the interior of the light shielding portion 14, the less the deposition volume of the inorganic material is. Therefore, the ultimately formed first pixel define layer B appears to be gradually changed in gradient, and gradually decreases from an edge to an interior thereof. In this embodiment, the first distance can allow the first pixel define region B being deposited with the inorganic material, too. Otherwise, in case that the light shielding portion 14 is completely adhered on the cathode 122, the inorganic material cannot be deposited in the first pixel define region B. In this embodiment, the various values of the first distance can adjust the film thickness of the first pixel define region B to be gradually changed in gradient. When the first distance is larger, the interior of the first pixel define region B has the larger film thickness; when the first distance is smaller, the interior of the first pixel define region B has the smaller film thickness. Accordingly, the film thickness change rate from the edge to the interior of the first pixel define region B is adjusted. Besides, in one deposition process, the first distance also can be a variable value to adjust the film thicknesses of the respective positions in the first pixel define region B for achieving the objective of dynamically adjusting the film thickness change rate.

Figure 10:
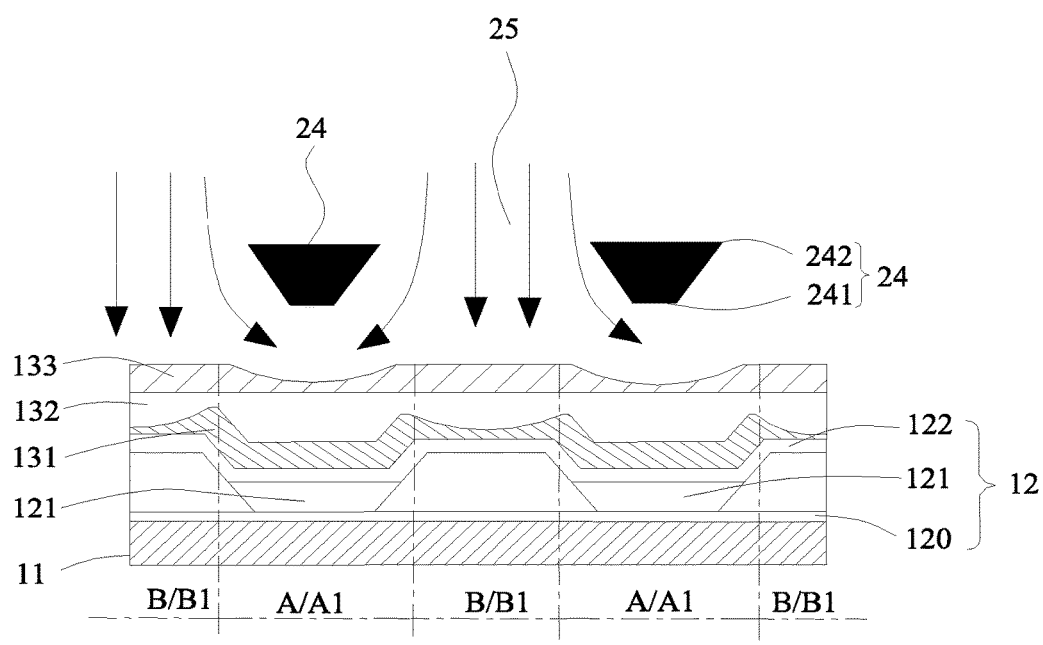
FIG. 10 is one another process operation diagram in the OLED package method shown in FIG. 7.

In S130, as shown in FIG. 10, the first organic layer 132 is deposited on the first package layer 131. The first organic layer 132 is flexible and can buffer, absorb and reduce the thin film stress of the first package layer 131 manufactured with the inorganic material. The first organic layer 132 also can act the function to the planarization of the first package layer 131 to promote the deposition quality of the following film layer.

In S140 and S150, as shown in FIG. 10, the second mask is located on the first organic layer 132 to make a gap between the second mask and the flexible substrate 11 to be a second distance. The specific number of the second distance is determined according to the actual requirement, and the second distance is larger than the first distance. Then, one layer of inorganic material is deposited on the first organic layer 132 through the second mask to form the second package layer 133.

What is similar with the structure of the first mask, the second mask comprises a light shielding portion 24 and a light transmitting portion 25 which are in alternately adjacent arrangement. The package material is deposited on the first organic layer 132 through the light transmitting portion 25. The light shielding portion 24 has a third end 241 and a fourth end 242 which are opposite, and a width of the third end 241 is smaller than a width of the fourth end 242. In the sectional view diagram of the second mask shown in FIG. 10, a dimension of the first end 241 is smaller than a dimension of the second end 242 along the horizontal direction. The light shielding portion 24 appears to be a big end up inverted trapezoid. In this embodiment, the light shielding portion 24 is illustrated to be a big end up inverted trapezoid: in other embodiments, under the premise that the width of the second end is smaller than the width of the second, the light shielding portion 24 can be in other shapes. The third end 241 face toward the first organic layer 132, and the fourth end 242 is back on the first organic layer 132. However, the difference from the first mask is that the light shielding portion 24 is configured corresponding to the pixel (i.e. corresponding to the A1 region), and the light transmitting portion 25 is configured corresponding to the pixel define layer (i.e. the B1 region). Namely, the second mask and the first mask are just dislocated. In practical process, due to the reasons of saving the cost and promoting the process apparatus usage rate, the first mask can be shifted to be dislocated from the last process position, and thus the first mask continues to be used to deposit the second package layer 133. Then, the second mask is the first mask after dislocation arrangement. Certainly, the first mask and the second mask can be two different masks, either.

Therefore, according to the material deposition principle described in S120, the second package layer 133 is formed with a second pixel region A1 and a second pixel define region B1, and a film thickness of the second pixel region A1 is smaller than a film thickness of the second pixel define region B1; and the second pixel region A1 appears to be gradually changed in gradient, and gradually decreases from an edge to an interior thereof.

In this embodiment, the function of the second distance corresponds to the first distance. The second distance can make the second pixel region A1 to be deposited with an inorganic material; the specific number of the second distance is determined according to the actual requirement. The various values of the second distance can adjust the film thickness of the second pixel region A1 to be gradually changed in gradient. When the second distance is larger, the interior of the second pixel region A1 has the larger film thickness; when the second distance is smaller, the interior of the second pixel region A1 has the smaller film thickness. Accordingly, the film thickness change rate from the edge to the interior of the second pixel region A1 is adjusted. Besides, in one deposition process, the second distance also can be a variable value to adjust the film thicknesses of the respective positions in the second pixel region A1 for achieving the objective of dynamically adjusting the film thickness change rate.

Therefore, in the OLED package method 100 of the present application, both the light shielding portion 14 of the first mask and the light shielding portion 24 of the second mask are configured to be the shapes, of which one end is large and the other end is small, and thus the first package layer 131 and the second package layer 133, of which the region with the larger film thickness and the region with the smaller film thickness are adjacent and alternately arranged can be respectively formed with the aforesaid two masks. In comparison with the solution of forming the first package layer 131 and the second package layer 133 with the uniform film thickness (the thin film stresses in the respective regions are basically consistent), the present package method 100 can make the thin film stresses of the first package layer 131 and the second package layer 132 gradually decrease from the region with the larger film thickness to the region with the smaller film thickness to decrease the crack occurring possibility; with arrangement of dislocating the light shielding portion 24 from the light shielding portion 14, the structure that the thick portion and the thin portion on the first package layer 131 and the thick portion and the thin portion on the second package layer 133 are in staggered correspondence arrangement makes that the thicker portion on the second package layer 133 just makes up the thinner portion on the first package layer 131, and thus the second package layer 133 can act the enhancement function to the water, oxygen resistance capability of the first package layer 131; besides, with depositing the first organic layer 132 with flexibility, it can not only buffer, absorb and reduce the thin film stresses of the first package layer 131 and the second package layer 133 but also reduce the risk that a crack occurs, and moreover, it also can act the function to the planarization of the first package layer 131 to promote the deposition quality of the second package layer 132.

Furthermore, in the ninth embodiment of the present invention, the difference from the eighth embodiment is that after the aforesaid step S150, the OLED package method further comprises:

configuring a barrier film on the second package layer. The configuration of the barrier film is to protect the entire package structure. The configuration of the barrier film can comprise adhesion but not limited thereto.

Furthermore, in the tenth embodiment of the present invention, the difference from the eighth embodiment is that after the aforesaid step S150, the OLED package method further comprises:

depositing a second organic layer on the second package layer;

configuring the first mask on the second organic layer to make a gap between the first mask and the flexible substrate, wherein the light shielding portion of the first mask corresponds to the pixel define layer on the flexible substrate, and the light transmitting portion of the first mask corresponds to the pixels of the flexible substrate, and the first end faces toward the second organic layer, and the second end is back on the second organic layer;

depositing an inorganic material on the second organic layer with the first mask to form a third package layer, and then removing the first mask; wherein a third pixel region corresponding to the first pixel region and a third pixel define region corresponding to the first pixel define region are formed in the third package layer, and a film thickness of the third pixel region is larger than a film thickness of the third pixel define region, and the film thickness of the third pixel define region gradually decreases from an edge to an interior of the third pixel define region.

Specifically, in this embodiment, the second organic layer and the third package layer are deposited and stacked again on the previous sandwich biscuit OLED package structure, and then the dual sandwich biscuit OLED package structure is formed. The deposition of the second organic layer is the same as that of the first organic layer. The deposition of the third package layer is implemented with the first mask. The third mask is configured at the position which is away from the flexible substrate with a third distance to make the first end of the first mask face toward the second organic layer, and the second end back on the second organic layer. Then, the light shielding portion of the first mask corresponds to the pixel define layer on the flexible substrate, and the light transmitting portion of the first mask corresponds to the pixel on the flexible substrate. Therefore, the third package layer of which the shape is consistent with the first package layer but just in the different deposition location is formed. Because the deposition of the corresponding film layer has been described in detail in the aforesaid embodiment, the repeated description is omitted here. In this embodiment, the third distance is larger than the second distance and the first distance. The function of the third distance corresponds to the first distance and the second distance. The detail description is omitted here. The OLED package method of this embodiment forms a dual sandwich biscuit structure, which can be applied to another package requirement of the OLED element. In other embodiment, the organic layers and package layers of more numbers can be deposited and stacked according to the requirement to realize the multi-layer sandwich biscuit structure.

Furthermore, in the eleventh embodiment of the present application, the difference from the tenth embodiment is that after the step of depositing the inorganic material on the second organic layer with the first mask to form the third package layer, and then removing the first mask, the OLED package method further comprises:

forming a barrier film on the third package layer.

Similarly, the configuration of the barrier film is to protect the entire package structure. The configuration of the barrier film can comprise adhesion but not limited thereto.

Furthermore, in the twelfth embodiment of the present application, the difference from the eighth embodiment to the tenth embodiment is that before step S110, the OLED package method further comprises:

depositing an inorganic layer on the OLED element, wherein the inorganic layer is located between the OLED element and the first package layer. In this embodiment, the configuration of the inorganic layer is to protect the OLED element to prevent the damage of the following package to the OLED element. The inorganic layer can be manufactured by utilizing kinds of processes. The thermal evaporation of Lithium fluoride (LiF) can be illustrated.

All of the eighth embodiment to the twelfth embodiment are all employed for the sandwich biscuit structures of two package layers with one organic layer in between, wherein the respective package layers are all manufactured with an inorganic material. The difference is that in the thirteenth embodiment, the OLED package method comprises:

configuring a first mask on one side of the flexible substrate, which is deposited with an OLED element to make a gap between the first mask and the flexible substrate; wherein the first mask comprises a light transmitting portion and a light shielding portion, and the light shielding portion of the first mask comprises a first end and a second end which are opposite, and a width of the first end is smaller than a width of the second end, and the light shielding portion of the first mask corresponds to a pixel define layer on the flexible substrate, and the light transmitting portion of the first mask corresponds to pixels on the flexible substrate, and the first end faces toward the OLED element, and the second end is back on the OLED element;

depositing a doped material on the OLED element with the first mask to form a first package layer, and then removing the first mask; wherein a first pixel region corresponding to the pixels and a first pixel define region corresponding to the pixel define layer are formed in the first package layer, and a film thickness of the first pixel region is larger than a film thickness of the first pixel define region, and the film thickness of the first pixel define region gradually decreases from an edge to an interior of the first pixel define region;

configuring a second mask on the first package layer to make a gap between the second mask and the flexible substrate; wherein the second mask comprises a light transmitting portion and a light shielding portion, and the light shielding portion of the second mask comprises a third end and a fourth end which are opposite, and a width of the third end is smaller than a width of the fourth end, and the light shielding portion of the second mask corresponds to a pixel distribution region on the flexible substrate, and the light transmitting portion of the second mask corresponds to a pixel restriction distribution region on the flexible substrate, and the third end faces toward the first package layer, and the fourth end is back on the first package layer;

depositing a doped material on the first package layer with the second mask to form a second package layer, and then removing the second mask; wherein a second pixel region corresponding to the first pixel region and a second pixel define region corresponding to the first pixel define region are formed in the second package layer, and a film thickness of the second pixel region is smaller than a film thickness of the second pixel define region, and the film thickness of the second pixel region gradually decreases from an edge to an interior of the second pixel region.

In this embodiment, the configurations of the first mask and the second mask and the depositions of the first package layer and the second package layer are in accordance with the eighth embodiment to the twelfth embodiment; the difference is that in this embodiment, both the first package layer and the second package layer are made of a doped material, and the first organic layer is not deposited. The material property of the doped material is between the organic material and the inorganic material. The anti crack property of the film layer manufactured with this material can be promoted. Thus, there is no need to configure a first organic layer between the first package layer and the second package layer. Namely, the risk of the crack occurrence among the respective package layers can be reduced. Because the deposition of the corresponding film layer has been described in detail as aforementioned, the repeated description is omitted here.

The foregoing descriptions are merely the specific embodiments of the present application. However, the present application is not limited thereby. Any modifications, equivalent replacements or improvements within the spirit and principles of the embodiment described above, which can be easily derived by those skilled persons in this art from the technical field disclosed in the present application should be covered by the protected scope of the application. Thus, the patent protection scope of the present application should be subjected to what is claimed is.

What is claimed is:

1. An OLED package structure, wherein the structure comprises a package unit and a flexible substrate deposited with an OLED element; the package unit comprises a first package layer, a first organic layer and a second package layer, which sequentially stack up on the OLED element, and both the first package layer and the second package layer are manufactured with an inorganic material; the first package layer comprises a first pixel region and a first pixel define region, and a film thickness of the first pixel region is larger than a film thickness of the first pixel define region, and the film thickness of the first pixel define region gradually decreases from an edge to an interior of the first pixel define region; the second package layer comprises a second pixel region corresponding to the first pixel region and a second pixel define region corresponding to the first pixel define region, and a film thickness of the second pixel region is smaller than a film thickness of the second pixel define region, and the film thickness of the second pixel region gradually decreases from an edge to an interior of the second pixel region;

wherein the package unit further comprises a second organic layer and a third package layer, which sequentially stack up on the second package layer, and the third package is manufactured with an inorganic material; the third package layer comprises a third pixel region corresponding to the first pixel region and a third pixel define region corresponding to the first pixel define region, and a film thickness of the third pixel region is larger than a film thickness of the third pixel define region, and the film thickness of the third pixel define region gradually decreases from an edge to an interior of the third pixel define region.

2. The OLED package structure according to claim 1, wherein the package unit further comprises an inorganic layer configured on the OLED element, and the inorganic layer is located between the OLED element and the first package layer.

3. The OLED package structure according to claim 1, wherein the package unit further comprises an inorganic layer configured on the OLED element, and the inorganic layer is located between the OLED element and the first package layer.

4. The OLED package structure according to claim 1, wherein the package unit further comprises a barrier film configured on the second package layer.

5. The OLED package structure according to claim 1, wherein the first pixel region completely covers a pixel region corresponding thereto, and an area of the first pixel region is larger than an area of the pixel region, and the pixel region comprises one or more than two of the OLED elements.

6. The OLED package structure according to claim 1, wherein the first pixel region completely covers a pixel region corresponding thereto, and an area of the first pixel region is larger than an area of the pixel region, and the pixel region comprises one or more than two of the OLED elements.

7. An OLED package method, wherein the method comprises:
configuring a first mask on one side of the flexible substrate, which is deposited with an OLED element to make a gap between the first mask and the flexible substrate; wherein the first mask comprises a light transmitting portion and a light shielding portion, and the light shielding portion of the first mask comprises a first end and a second end which are opposite, and a width of the first end is smaller than a width of the second end, and the light shielding portion of the first mask corresponds to a pixel define layer on the flexible substrate, and the light transmitting portion of the first mask corresponds to pixels on the flexible substrate, and the first end faces toward the OLED element, and the second end is back on the OLED element;
depositing an inorganic material on the OLED element with the first mask to form a first package layer, and then removing the first mask; wherein a first pixel region corresponding to the pixels and a first pixel define region corresponding to the pixel define layer are formed in the first package layer, and a film thickness of the first pixel region is larger than a film thickness of the first pixel define region, and the film thickness of the first pixel define region gradually decreases from an edge to an interior of the first pixel define region;
depositing a first organic layer on the first package layer;
configuring a second mask on the first organic layer to make a gap between the second mask and the flexible substrate; wherein the second mask comprises a light transmitting portion and a light shielding portion, and the light shielding portion of the second mask comprises a third end and a fourth end which are opposite, and a width of the third end is smaller than a width of the fourth end, and the light shielding portion of the second mask corresponds to a pixel distribution region on the flexible substrate, and the light transmitting portion of the second mask corresponds to a pixel restriction distribution region on the flexible substrate, and the third end faces toward the first organic layer, and the fourth end is back on the first organic layer;
depositing an inorganic material on the first organic layer with the second mask to form a second package layer, and then removing the second mask; wherein a second pixel region corresponding to the first pixel region and a second pixel define region corresponding to the first pixel define region are formed in the second package layer, and a film thickness of the second pixel region is smaller than a film thickness of the second pixel define region, and the film thickness of the second pixel region gradually decreases from an edge to an interior of the second pixel region.

8. The OLED package method according to claim 7, wherein before the step of configuring the first mask on one side of the flexible substrate, the method further comprises:
depositing an inorganic layer on the OLED element, wherein the inorganic layer is located between the OLED element and the first package layer.

9. The OLED package method according to claim 7, wherein the method further comprises:
depositing a second organic layer on the second package layer;
configuring the first mask on the second organic layer to make a gap between the first mask and the flexible substrate, wherein the light shielding portion of the first mask corresponds to the pixel define layer on the flexible substrate, and the light transmitting portion of the first mask corresponds to the pixels of the flexible substrate, and the first end faces toward the second organic layer, and the second end is back on the second organic layer;
depositing an inorganic material on the second organic layer with the first mask to form a third package layer, and then removing the first mask; wherein a third pixel region corresponding to the first pixel region and a third pixel define region corresponding to the first pixel define region are formed in the third package layer, and a film thickness of the third pixel region is larger than a film thickness of the third pixel define region, and the film thickness of the third pixel define region gradually decreases from an edge to an interior of the third pixel define region.

10. The OLED package method according to claim 9, wherein before the step of configuring the first mask on one side of the flexible substrate, the method further comprises:
depositing an inorganic layer on the OLED element, wherein the inorganic layer is located between the OLED element and the first package layer.

* * * * *